(12) United States Patent
Pradhan et al.

(10) Patent No.: US 10,998,445 B2
(45) Date of Patent: *May 4, 2021

(54) INTERLAYER DIELECTRIC FOR NON-PLANAR TRANSISTORS

(71) Applicant: Intel Corporation, Santa Clara, CA (US)

(72) Inventors: Sameer S. Pradhan, Portland, OR (US); Jeanne L. Luce, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/877,355

(22) Filed: May 18, 2020

(65) Prior Publication Data

US 2020/0279950 A1    Sep. 3, 2020

Related U.S. Application Data

(63) Continuation of application No. 16/040,053, filed on Jul. 19, 2018, now Pat. No. 10,693,006, which is a
(Continued)

(51) Int. Cl.
*H01L 29/78*     (2006.01)
*H01L 29/66*     (2006.01)
(Continued)

(52) U.S. Cl.
CPC ...... *H01L 29/7851* (2013.01); *H01L 21/0234* (2013.01); *H01L 21/02304* (2013.01);
(Continued)

(58) Field of Classification Search
CPC .......... H01L 29/7851; H01L 21/76829; H01L 21/76826; H01L 21/76897;
(Continued)

(56) References Cited

U.S. PATENT DOCUMENTS 7,585,570 B2   9/2009  Takeko et al.
7,655,574 B2   2/2010  Sugawara et al.
(Continued)

FOREIGN PATENT DOCUMENTS

CN        1930668       3/2007
CN      101584025      11/2009
(Continued)

OTHER PUBLICATIONS

Corrected Notice of Allowance for U.S. Appl. No. 13/992,542, dated May 13, 2015.
(Continued)

*Primary Examiner* — Mohammed R Alam
(74) *Attorney, Agent, or Firm* — Green, Howard & Mughal LLP

(57) ABSTRACT

The present description relates the formation of a first level interlayer dielectric material layer within a non-planar transistor, which may be formed by a spin-on coating technique followed by oxidation and annealing. The first level interlayer dielectric material layer may be substantially void free and may exert a tensile strain on the source/drain regions of the non-planar transistor.

20 Claims, 15 Drawing Sheets

Related U.S. Application Data continuation of application No. 15/400,958, filed on Jan. 6, 2017, now Pat. No. 10,056,488, which is a continuation of application No. 14/802,902, filed on Jul. 17, 2015, now Pat. No. 9,634,124, which is a continuation of application No. 13/992,542, filed as application No. PCT/US2011/063433 on Dec. 6, 2011, now Pat. No. 9,087,915.

(51) Int. Cl.
*H01L 21/02* (2006.01)
*H01L 21/768* (2006.01)
*H01L 21/8234* (2006.01)

(52) U.S. Cl.
CPC .. *H01L 21/02323* (2013.01); *H01L 21/02337* (2013.01); *H01L 21/02356* (2013.01); *H01L 21/76826* (2013.01); *H01L 21/76829* (2013.01); *H01L 21/76897* (2013.01); *H01L 21/823431* (2013.01); *H01L 29/66545* (2013.01); *H01L 29/66575* (2013.01); *H01L 29/66795* (2013.01); *H01L 29/785* (2013.01); *H01L 29/7843* (2013.01); *H01L 29/7848* (2013.01); *H01L 21/02282* (2013.01); *H01L 21/76834* (2013.01)

(58) Field of Classification Search
CPC ......... H01L 21/02356; H01L 29/66575; H01L 21/823431; H01L 29/7843; H01L 29/7848; H01L 21/02304; H01L 21/02323; H01L 21/02337; H01L 21/0234; H01L 29/66545; H01L 29/66795; H01L 21/76834; H01L 21/02282; H01L 29/7842–7849; H01L 29/785–7856
See application file for complete search history.

(56) References Cited

U.S. PATENT DOCUMENTS

| | | | |
|---|---|---|---|
| 9,202,699 B2 | 12/2015 | Rosenbaum et al. | |
| 2002/0055271 A1 | 5/2002 | Lee et al. | |
| 2003/0038313 A1 | 2/2003 | Furuhata | |
| 2006/0088967 A1 | 4/2006 | Hsiao et al. | |
| 2006/0189058 A1 | 8/2006 | Lee et al. | |
| 2006/0223290 A1 | 10/2006 | Belyansky et al. | |
| 2007/0048958 A1 | 3/2007 | Liao et al. | |
| 2008/0014710 A1 | 1/2008 | Bian et al. | |
| 2008/0233699 A1 | 9/2008 | Booth et al. | |
| 2009/0081840 A1* | 3/2009 | Park | H01L 21/823807 438/287 |
| 2009/0246973 A1 | 10/2009 | Clark | |
| 2010/0105215 A1 | 4/2010 | Sugawara et al. | |
| 2010/0155842 A1 | 6/2010 | Anderson et al. | |
| 2011/0147812 A1 | 6/2011 | Steigerwald et al. | |
| 2011/0272739 A1 | 11/2011 | Lee et al. | |
| 2012/0032240 A1 | 2/2012 | Mayuzumi | |

FOREIGN PATENT DOCUMENTS

| | | |
|---|---|---|
| KR | 1020040050519 | 6/2004 |
| KR | 1020080021918 | 3/2008 |
| WO | 2013048516 | 4/2013 |

OTHER PUBLICATIONS

Final Office Action for U.S. Appl. No. 14/802,902, dated Sep. 26, 2016.
International Preliminary Report on Patentability and Written Opinion received for PCT Patent Application No. PCT/ US2011/063433 dated Jun. 19, 2014, 10 pages.
International Search Report and Written Opinion received for PCT Patent Application No. PCT/US2011/063433, dated Jul. 20, 2012, 9 pages.
Non-Final Office Action for U.S. Appl. No. 13/992,542, dated Aug. 27, 2014.
Non-Final Office Action for U.S. Appl. No. 16/040,053 dated Oct. 4, 2019.
Non-Final Office Action for U.S. Appl. No. 14/802,902, dated Mar. 8, 2016.
Notice of Allowance for U.S. Appl. No. 15/400,958, dated Aug. 25, 2017.
Notice of Allowance for U.S. Appl. No. 15/400,958, dated May 7, 2018.
Notice of Allowance for U.S. Appl. No. 13/992,542, dated Feb. 18, 2015.
Notice of Allowance for U.S. Appl. No. 14/802,902, dated Jan. 1, 2017.
Notice of Allowance from Chinese Patent Application No. 201180075347.7 dated Aug. 4, 2016, 4 pgs.
Notice of Allowance from U.S. Appl. No. 16/040,053 dated Mar. 3, 2020, 10 pgs.
Notice of Allowance received for Taiwan Patent Application No. 101144138, dated Jul. 20, 2016, 2 pages of Taiwan NOA and 1 page of translation.
Office Action for German Patent Application No. 112011105925.6, dated Jan. 3, 2018.
Office Action received for Chinese Patent Application No. 201180075347.7, dated Mar. 23, 2016, 7 pages of Chinese Office Action only.
Office Action received for Germany Patent Application No. 112011105925.6, dated Feb. 29, 2016, 4 pages of English Translation and 4 pages of German Office Action.
Office Action received for Taiwan Patent Application No. 101144138, dated Feb. 17, 2016, 6 pages of Taiwan Office Action and 1 page English Search report.
Office Action from German Patent Application No. 112011105925.6 dated Dec. 3, 2020, 10 pgs.

* cited by examiner

INTERLAYER DIELECTRIC FOR NON-PLANAR TRANSISTORS

RELATED APPLICATIONS

The present application is a continuation of U.S. patent application Ser. No. 16/040,053, filed on Jul. 19, 2018, entitled "INTERLAYER DIELECTRIC FOR NON-PLANAR TRANSISTORS", which is a continuation of U.S. patent application Ser. No. 15/400,958, filed on Jan. 6, 2017, entitled "INTERLAYER DIELECTRIC FOR NON-PLANAR TRANSISTORS", now U.S. Pat. No. 10,056,488 issued on Aug. 21, 2018, which is a continuation of U.S. patent application Ser. No. 14/802,902, filed on Jul. 17, 2015, entitled "INTERLAYER DIELECTRIC FOR NON-PLANAR TRANSISTORS", now U.S. Pat. No. 9,634,124 issued Apr. 25, 2017, which is a continuation of U.S. patent application Ser. No. 13/992,542, filed on Jun. 7, 2013, entitled "INTERLAYER DIELECTRIC FOR NON-PLANAR TRANSISTORS", now U.S. Pat. No. 9,087,915 issued Jul. 21, 2015, which claims priority under 35 U.S.C. 371 from International Application No. PCT/US2011/063433, filed on Dec. 6, 2011, entitled "INTERLAYER DIELECTRIC FOR NON-PLANAR TRANSISTORS", which are hereby incorporated herein by reference in their entirety and for all purposes.

BACKGROUND

Embodiments of the present description generally relate to the field of microelectronic device fabrication and, more particularly, to the fabrication of a first level interlayer dielectric material layer in a non-planar transistor.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
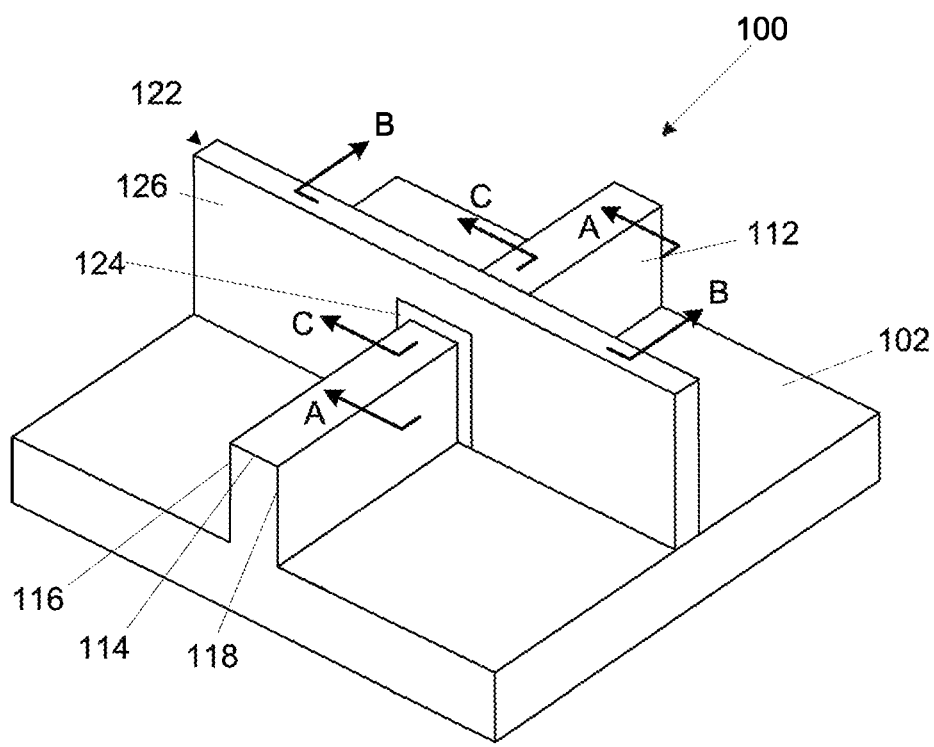
FIG. 1 is a perspective view of a non-planar transistor, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

In the fabrication of non-planar transistors, such as tri-gate transistors and FinFETs, non-planar semiconductor bodies may be used to form transistors capable of full depletion with very small gate lengths (e.g., less than about 30 nm). These semiconductor bodies are generally fin-shaped and are, thus, generally referred to as transistor "fins". For example in a tri-gate transistor, the transistor fins have a top surface and two opposing sidewalls formed on a bulk semiconductor substrate or a silicon-on-insulator substrate. A gate dielectric may be formed on the top surface and sidewalls of the semiconductor body and a gate electrode may be formed over the gate dielectric on the top surface of the semiconductor body and adjacent to the gate dielectric on the sidewalls of the semiconductor body. Thus, since the gate dielectric and the gate electrode are adjacent to three surfaces of the semiconductor body, three separate channels and gates are formed. As there are three separate channels formed, the semiconductor body can be fully depleted when the transistor is turned on. With regard to finFET transistors, the gate material and the electrode only contact the sidewalls of the semiconductor body, such that two separate channels are formed (rather than three in tri-gate transistors).

Embodiments of the present description relate to the formation of a first level interlayer dielectric material layer within a non-planar transistors, which may be formed by a spin-on coating technique followed by oxidation and annealing. The first level interlayer dielectric material layer may be substantially void free and may exert a tensile strain on the source/drain regions of the non-planar transistor.

FIG. 1 is a perspective view of a non-planar transistor 100, including at least one gate formed on at least one transistor fin, which are formed on a microelectronic substrate 102. In an embodiment of the present disclosure, the microelectronic substrate 102 may be a monocrystalline silicon substrate. The microelectronic substrate 102 may also be other types of substrates, such as silicon-on-insulator ("SOI"), germanium, gallium arsenide, indium antimonide, lead telluride, indium arsenide, indium phosphide, gallium arsenide, gallium antimonide, and the like, any of which may be combined with silicon.

The non-planar transistor, shown as a tri-gate transistor, may include at least one non-planar transistor fin 112. The non-planar transistor fin 112 may have a top surface 114 and a pair of laterally opposite sidewalls, sidewall 116 and opposing sidewall 118, respectively.

As further shown in FIG. 1, at least one non-planar transistor gate 122 may be formed over the non-planar transistor fin 112. The non-planar transistor gate 122 may be fabricated by forming a gate dielectric layer 124 on or adjacent to the non-planar transistor fin top surface 114 and on or adjacent to the non-planar transistor fin sidewall 116 and the opposing non-planar transistor fin sidewall 118. A gate electrode 126 may be formed on or adjacent the gate dielectric layer 124. In one embodiment of the present disclosure, the non-planar transistor fin 112 may run in a direction substantially perpendicular to the non-planar transistor gate 122.

The gate dielectric layer 124 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer 124 can be formed by well-known techniques, such as by conformally depositing a gate dielectric material and then patterning the gate dielectric material with well-known photolithography and etching techniques, as will be understood to those skilled in the art.

The gate electrode 126 can be formed of any suitable gate electrode material. In an embodiment of the present disclosure, the gate electrode 126 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 126 can be formed by well-known techniques, such as by blanket depositing a gate electrode material and then patterning the gate electrode material with well-known photolithography and etching techniques, as will be understood to those skilled in the art.

A source region and a drain region (not shown in FIG. 1) may be formed in the non-planar transistor fin 112 on opposite sides of the gate electrode 126. In one embodiment, the source and drain regions may be formed by doping the non-planar transistor fins 112, as will be understood to those skilled in the art. In another embodiment, the source and drain regions may be formed by removing portions of the non-planar transistor fins 112 and replacing these portions with appropriate material(s) to form the source and drain regions, as will be understood to those skilled in the art. In still another embodiment, the source and drain regions may be formed by exitaxially growing doped or undoped strain layers on the fins 112.

FIGS. 2-26 illustrate side cross-sectional view of one embodiment of fabricating a non-planar transistor, wherein FIGS. 2-5 are views along arrows A-A and B-B of FIG. 1, FIGS. 6-15 are views along arrows A-A of FIG. 1, and FIG. 16-26 are views along arrows C-C of FIG. 1.

Figure 2:
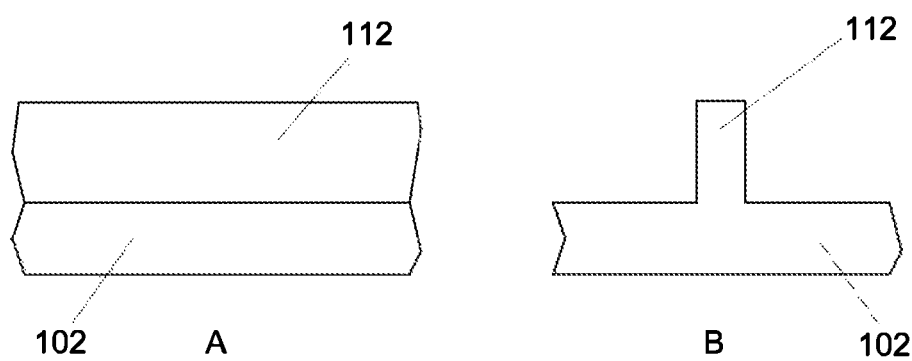
FIG. 2 illustrates side cross-sectional views of a non-planar transistor fin formed in or on a microelectronic substrate.
Figure 3:
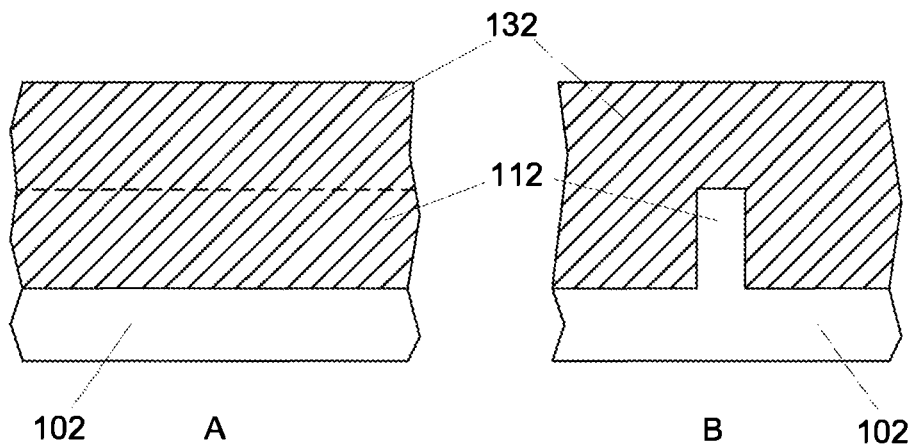
FIG. 3 illustrates side cross-sectional views of a sacrificial material deposited over the non-planar transistor fin of FIG. 2, according to an embodiment of the present description.
Figure 4:
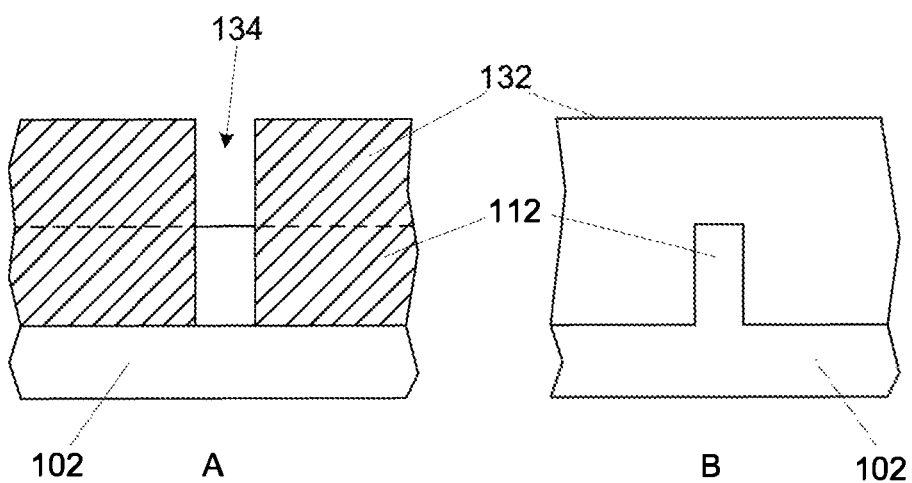
FIG. 4 illustrates side cross-sectional views of a trench formed in the sacrificial material deposited to expose a portion of the non-planar transistor fin of FIG. 3, according to an embodiment of the present description.

As shown in FIG. 2, the non-planar transistor fin 112 may be formed by etching the microelectronic substrate 102 or by forming the non-planar transistor fin 112 on the microelectronic substrate 102 by any technique known in the art. As illustrated in FIG. 3, a sacrificial material 132 may be deposited over the non-planar transistor fin 112, as shown in FIG. 3, and a trench 134 may be formed in the sacrificial material 132 to expose a portion of the non-planar transistor fin 112, as shown in FIG. 4. The sacrificial material 132 may be any appropriate material known in the art, and the trench 134 may be formed by any technique known in the art, including but not limited to lithographic masking and etching.

Figure 5:
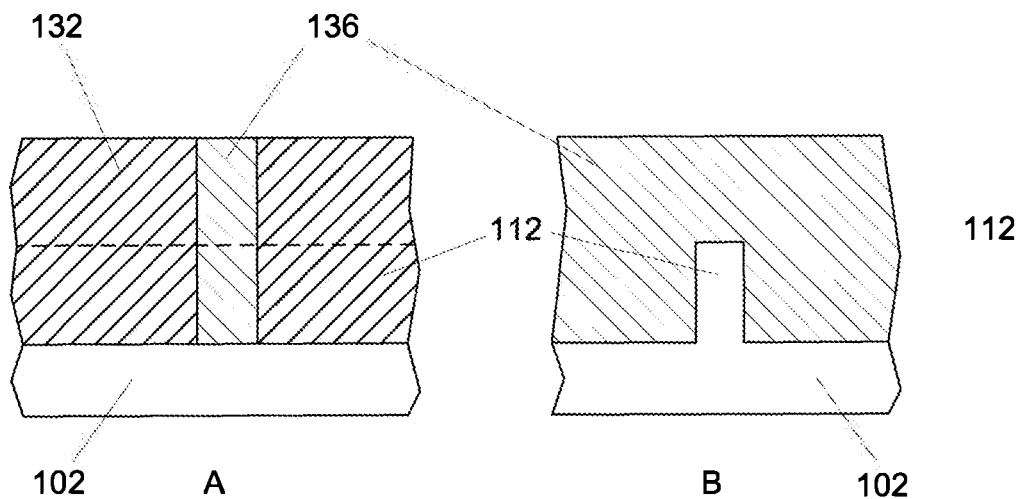
FIG. 5 illustrates side cross-sectional views of a sacrificial gate formed in the trench of FIG. 4, according to an embodiment of the present description.

As shown in FIG. 5, a sacrificial gate 136 may be formed in the trench 134 (see FIG. 4). The sacrificial gate 136 may be any appropriate material, such as a polysilicon material and the like, and may be deposited in the trench 134 (see FIG. 4) by any technique known in the art, including but not limited to chemical vapor deposition ("CVD") and physical vapor deposition ("PVD").

Figure 6:
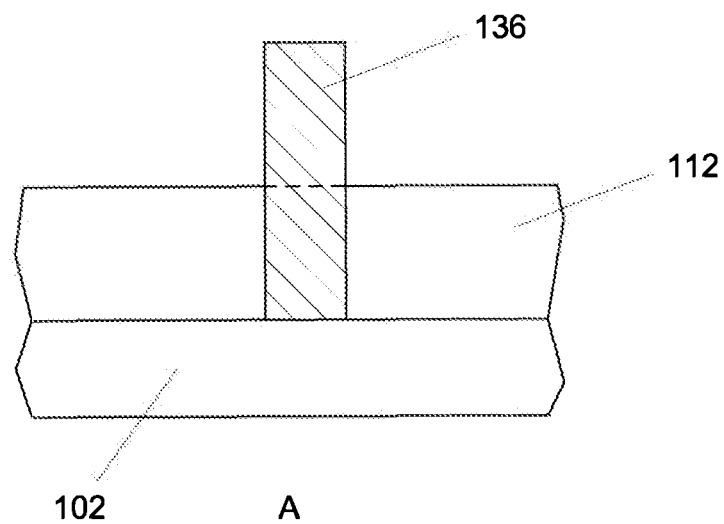
FIG. 6 illustrates a side cross-sectional view of the sacrificial gate after the removal of the sacrificial material of FIG. 5, according to an embodiment of the present description.
Figure 7:
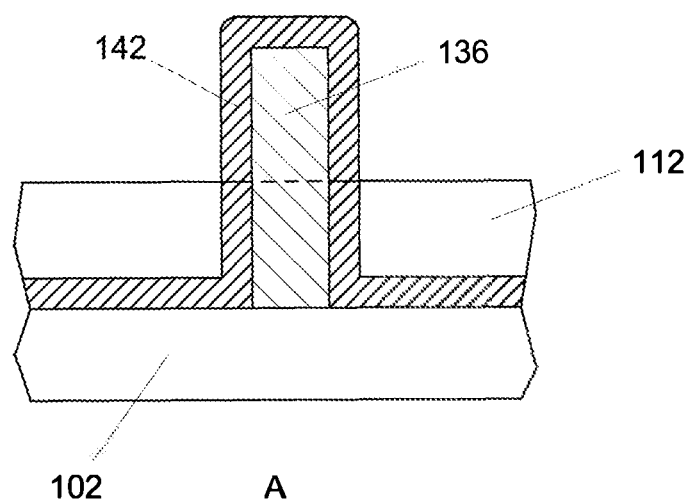
FIG. 7 illustrates a side cross-sectional view of a conformal dielectric layer deposited over the sacrificial gate and microelectronic substrate of FIG. 6, according to an embodiment of the present description.

As shown in FIG. 6, the sacrificial material 132 of FIG. 5 may be removed to expose the sacrificial gate 136 by any technique known in the art, such as selectively etching the sacrificial material 132. As shown in FIG. 7, a conformal dielectric layer 142 may be deposited over the sacrificial gate 136 and microelectronic substrate 102. The conformal dielectric layer 142 may be any appropriate material, including but not limited to silicon nitride ($Si_3N_4$) and silicon carbide (SiC), and may be formed by any appropriate technique including but not limited to atomic layer deposition ("ALD").

Figure 8:
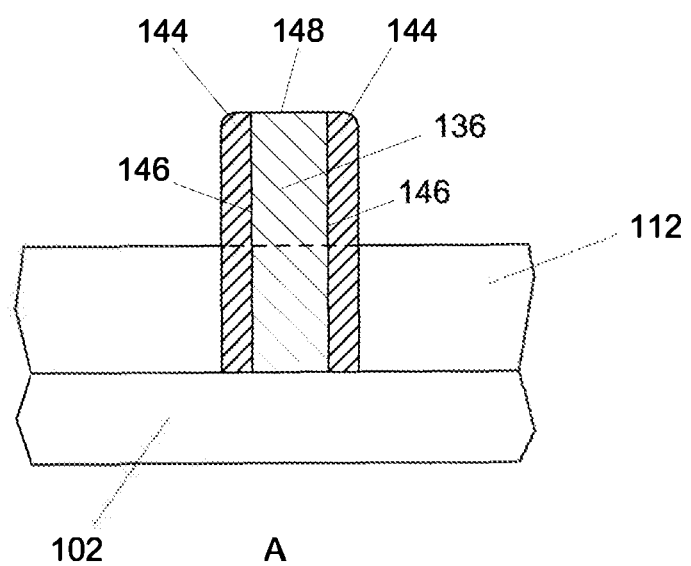
FIG. 8 illustrates a side cross-sectional view of gate spacers formed from the conformal dielectric layer of FIG. 7, according to an embodiment of the present description.

As shown in FIG. 8, the conformal dielectric layer 142 of FIG. 7 may be etched, such as by directional etch with an appropriate etchant, to form a pair of gate spacers 144 on sidewalls 146 of the sacrificial gate 136, while substantially removing the conformal dielectric layer 142 adjacent the microelectronic substrate 102 and a top surface 148 of the sacrificial gate 136. It is understood that fin spacers (not shown) may be simultaneously formed on sidewalls 116 and 118 (see FIG. 1) of the non-planar transistor fin 112 during the formation of the gate spacers 144.

Figure 9:
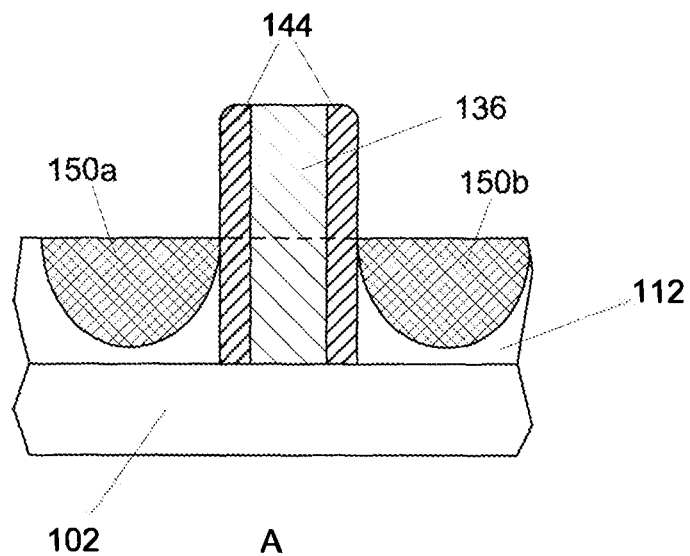
FIG. 9 illustrates a side cross-sectional view of a source region and a drain region formed in the non-planar transistor fin on either side of the gate spacers of FIG. 8, according to an embodiment of the present description.

As shown in FIG. 9, a source region 150a and a drain region 150b may be formed on either side of the gate spacers 144. In one embodiment, the source region 150a and the drain region 150b may be formed in the non-planar transistor fin 112 with the implantation of N-type or P-type ion dopants. As will be understood to those skilled in that art, dopant implantation is a process of introducing impurities into semiconducting materials for the purpose changing its conductivity and electronic properties. This is generally achieved by ion implantation of either P-type ions or N-type ions, collectively referred to as "dopants". In another embodiment, portions of the non-planar transistor fin 112 may be removed by any technique known in the art, such as etching, and the source region 150a and the drain region 150b may be formed in place of the removed portions. In still another embodiment, the source and drain regions may be formed by exitaxially growing doped or undoped strain layers on the fins 112. The source region 150a and the drain region will hereinafter be referred to collectively as "source/drain region 150". As will be understood to those skilled in the art, transistors having P-type source and drains are referred to as "PMOS" or "p-channel metal-oxide-semiconductor" transistors, and transistors having N-type source and drains are referred to as "NMOS" or "n-channel metal-oxide-semiconductor" transistors.

Figure 10:
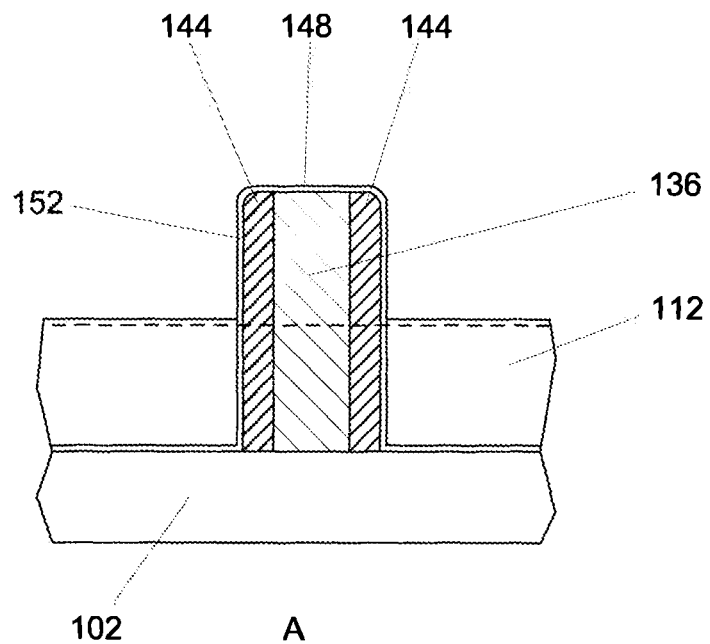
FIG. 10 illustrates a side cross-sectional view of an adhesion layer formed on the structure of FIG. 9, according to an embodiment of the present description.

As shown in FIG. 10, an adhesion liner 152, such as silicon dioxide, may be conformally deposited over the gate spacers 144, the sacrificial gate top surface 148, the non-planar transistor fin 112, and the microelectronic substrate 102. The adhesion line 152 may provide a sufficient adhesion between a subsequently formed interlayer dielectric material layer, and the structure of FIG. 9, i.e., the gate spacers 144, the sacrificial gate top surface 148, the non-planar transistor fin 112, and the microelectronic substrate 102.

Figure 11:
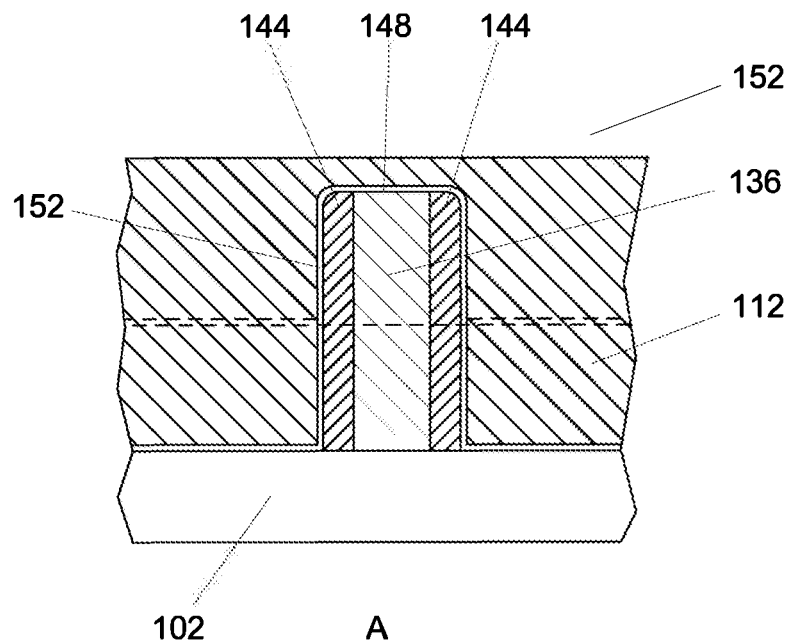
FIG. 11 illustrates a side cross-sectional view of a first interlayer dielectric material layer deposited over the gate spacers, the sacrificial gate, the non-planar transistor fin, and the microelectronic substrate of FIG. 10, according to an embodiment of the present description.

As shown in FIG. 11, a first interlayer dielectric material layer 154 may be formed on the adhesion liner 152 with a spin-on coating technique, which may be used to apply a substantially uniform thin film to a substrate. In one embodiment of the present description, an excess amount of interlayer dielectric material may be deposited on the adhesion liner 152. The microelectronic substrate 102 may then be rotated, generally at a high speed, to spread the interlayer dielectric material across the microelectronic substrate 102 by centrifugal force; thus, forming the first interlayer dielectric material layer 154. The spin-on coating technique may have the capability scale to relatively pitch sizes, while still achieving effective gap fill (e.g. little or substantially no void formation) even with high aspect ratio structures.

Figure 12:
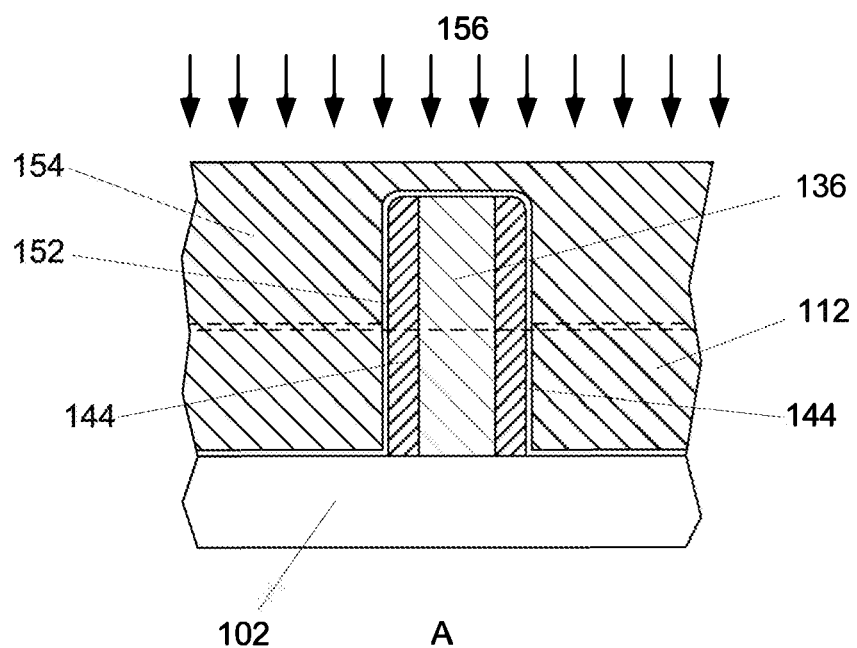
FIG. 12 illustrates a side cross-sectional view of the first interlayer dielectric material layer of FIG. 11 being oxidized and annealed, according to an embodiment of the present description.

As shown in FIG. 12, the first interlayer dielectric material layer 154 may be oxidized follow by an annealing (the oxidation and annealing steps are illustrated as arrows 156). Although the oxidation and annealing steps are illustrated in a single drawing with common arrows 156, this is merely for conciseness in the illustrations. It is understood that the oxidation and annealing steps can be separated by one or more processing steps.

In one embodiment, the oxidation may be performed in a vertical diffusion furnace at about 410 degrees Celsius in about a 93% steam atmosphere for about 2 hours. The oxidation may drive out solvent from the first interlayer dielectric material layer 154 and may result in a volume shrinkage of the first interlayer dielectric material layer 154 of between about 10% and 12%. This shrinkage may exert a tensile strain and has been shown to increase drive currents of NMOS trigate transistors up to about 7% due to channel mobility enhancement, as will be understood to those skilled in the art. In one embodiment, the annealing may be achieved by a two step anneal in a high density plasma chamber with a helium gas (or other such inert gas) atmosphere. The first step may comprise powering up RF electrodes within the high density plasma chamber, such as top and side electrodes, to about 16 kW for a time duration of about six (6) minutes. The second step may comprise powering up the high density plasma chamber RF electrodes, such as top and side electrodes, to about 6 kW for a time duration of about two (2) minutes.

Figure 13:
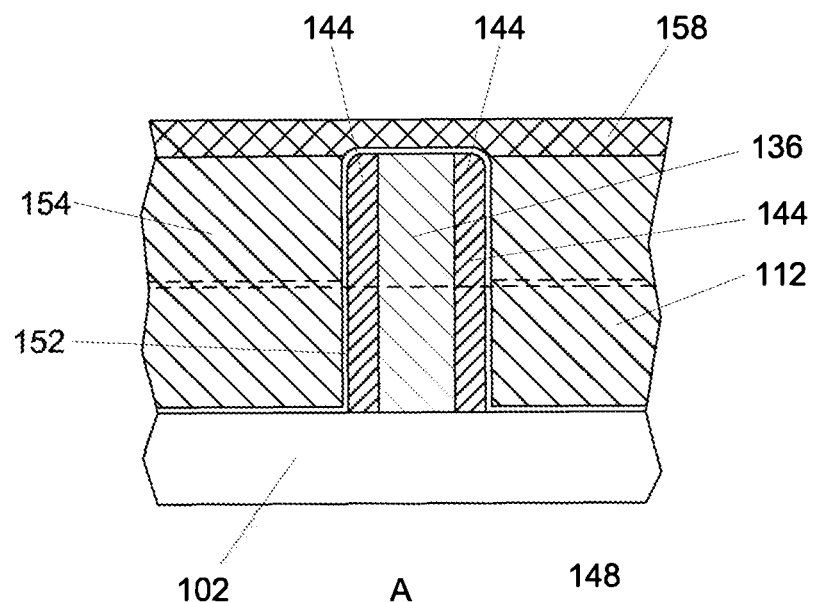
FIG. 13 illustrates a side cross-section view of the structure of FIG. 12 wherein a portion of the first interlayer dielectric material layer is densified by the oxidization and annealing of FIG. 13, according to an embodiment of the present description.

As shown in FIG. 13, a portion 158 of the first interlayer dielectric 154 may be densified as a result of the oxidation and annealing step previously described. The densified dielectric portion 158 may assist in protecting the first interlayer dielectric 154 during downstream processing.

Figure 14:
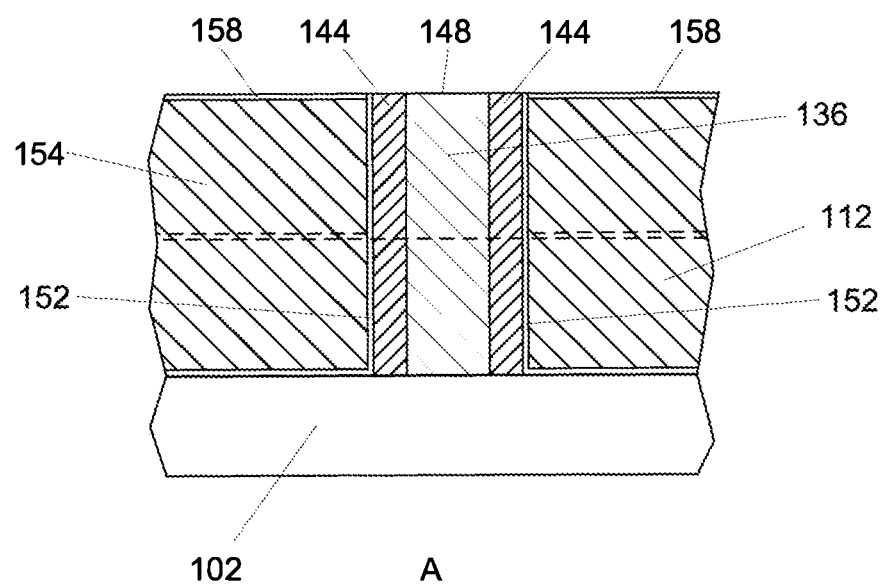
FIG. 14 illustrates a side cross-sectional view of the structure of FIG. 13 after planarizing the first interlayer dielectric material layer to expose a top surface of the sacrificial gate, according to an embodiment of the present description.

As shown in FIG. 14, the first interlayer dielectric layer 154 may be planarized to expose the sacrificial gate top surface 148. The planarization of the first dielectric material layer 154 may be achieved by any technique known in the art, including but not limited to chemical mechanical polishing (CMP). As shown in FIG. 14, a portion of the densified dielectric portion 158 may remain after planarization.

Figure 15:
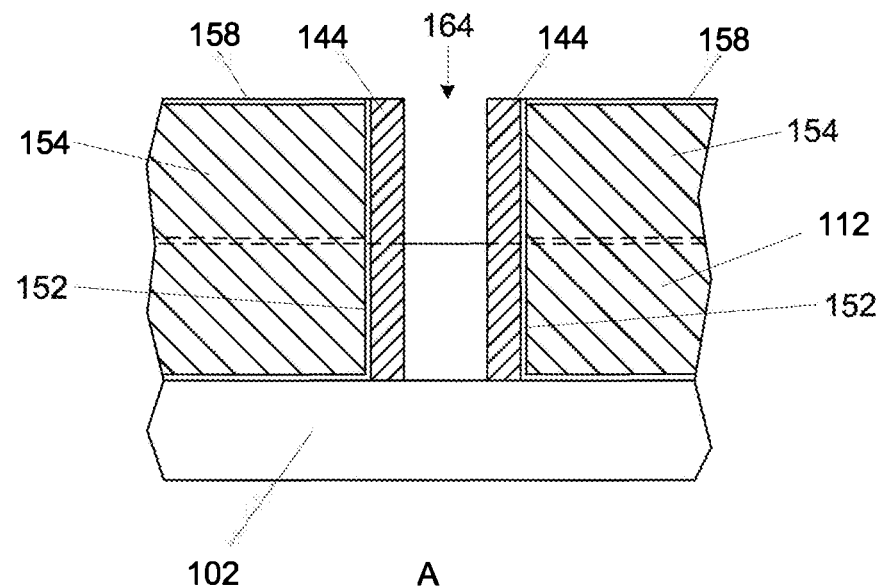
FIG. 15 illustrates a side cross-sectional view of the structure of FIG. 14 after the removal of the sacrificial gate to form a gate trench, according to an embodiment of the present description.
Figure 16:
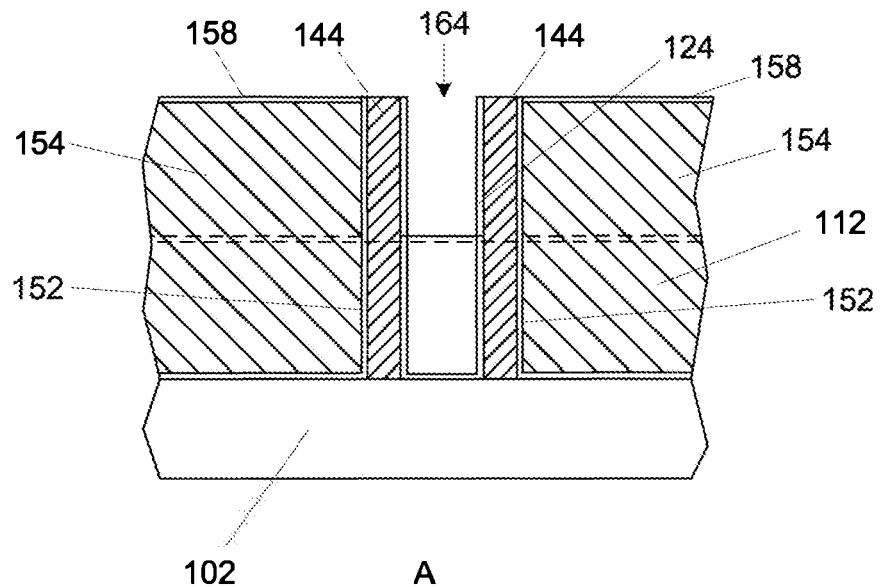
FIG. 16 illustrates a side cross-sectional view of the structure of FIG. 15 after the formation of a gate dielectric adjacent the non-planar transistor fin between the gate spacers, according to an embodiment of the present description.

As shown in FIG. 15, the sacrificial gate 136 of FIG. 14 may be removed to form a gate trench 164. The sacrificial gate 136 may be removed by any technique known in the art, such as a selective etch. As shown in FIG. 16, the gate dielectric layer 124, as also illustrated in FIG. 1, may be formed to abut the non-planar transistor fin 112, as previously discussed. The materials and methods of forming the gate dielectric 124 have been previously discussed.

Figure 17:
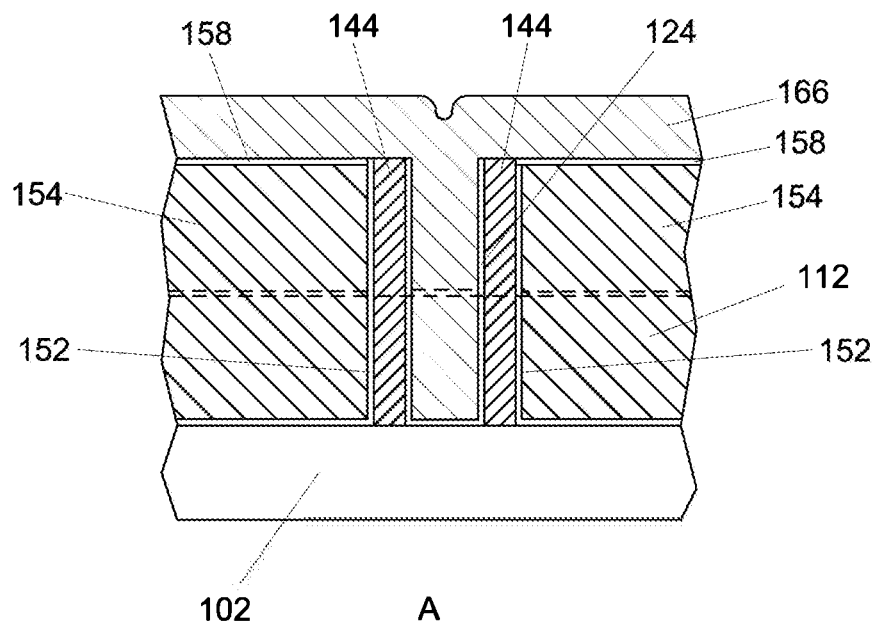
FIG. 17 illustrates a side cross-sectional view of a conductive gate material deposited in the gate trench of FIG. 16, according to an embodiment of the present description.
Figure 18:
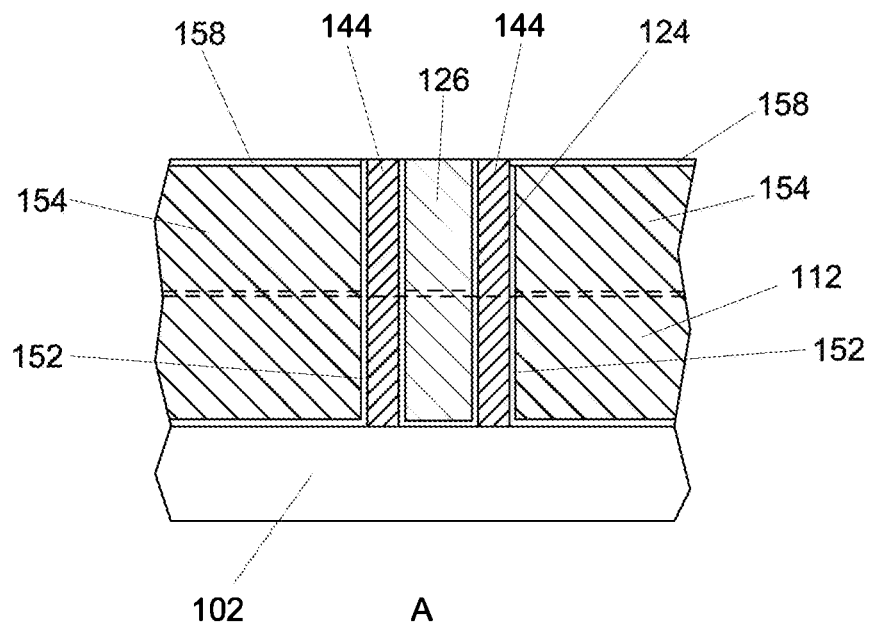
FIG. 18 illustrates a side cross-sectional view of the structure of FIG. 17 after the removal of excess conductive gate material to form a non-planar transistor gate, according to an embodiment of the present description.

As shown in FIG. 17, a conductive gate material 166 may be deposited in the gate trench 164, and excess conductive gate material 166 (e.g. conductive gate material 166 not within the gate trench 166 of FIG. 16) may be removed to from the non-planar transistor gate electrode 126 (see also FIG. 1), as shown in FIG. 18. The materials and methods of forming the gate electrode 126 have been previously discussed. The removal of the excess conductive gate material 166 may be achieved by any technique known in the art, including but not limited to chemical mechanical polishing (CMP), etching, and the like.

Figure 19:
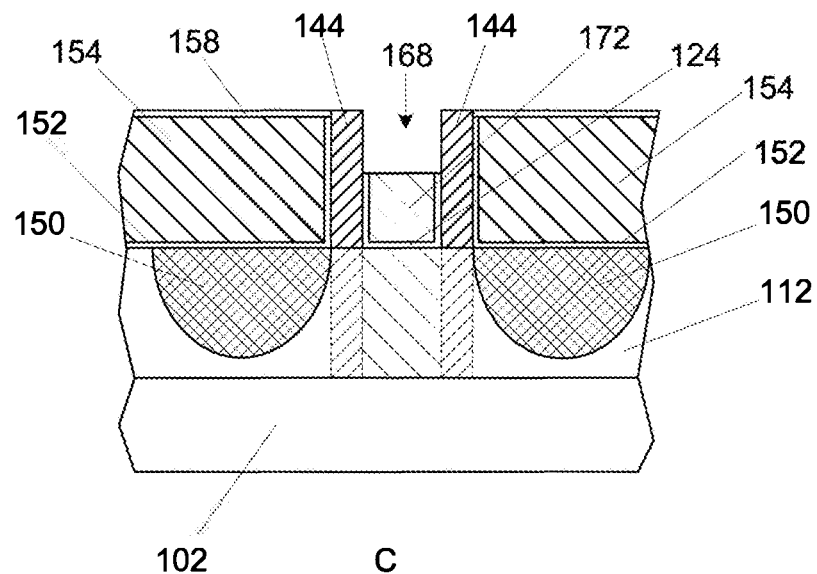
FIG. 19 illustrates a side cross-sectional view of the structure of FIG. 18 after etching away a portion of the non-planar transistor gate to form a recessed non-planar transistor gate, according to an embodiment of the present description.

As shown in FIG. 19, a portion of the non-planar transistor gate electrode 126 of FIG. 18 may be removed to form a recess 168 and a recessed non-planar transistor gate 172. The removal may be accomplished by any known technique, including but not limited to wet or dry etching. In one embodiment, the formation of the recess may result from a combination of a dry etch and a wet etch.

Figure 20:
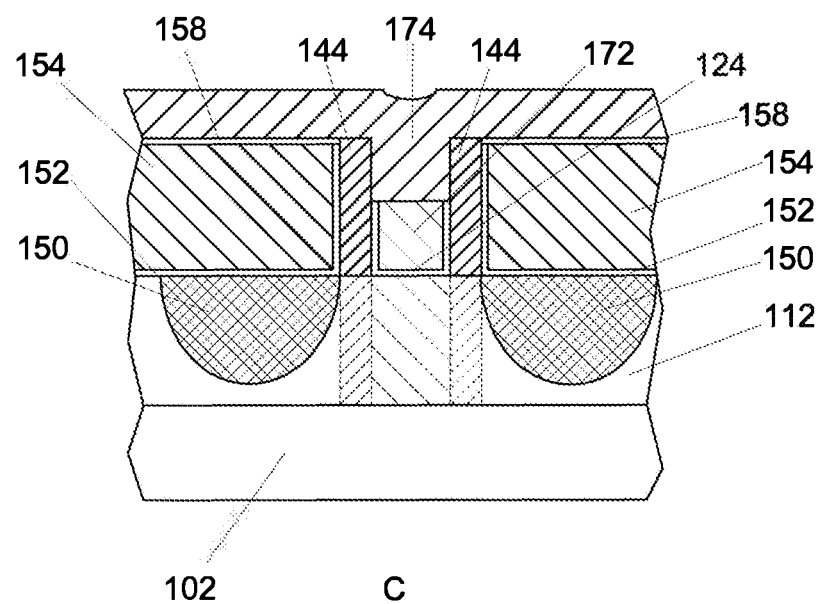
FIG. 20 illustrates a side cross-sectional view of the structure of FIG. 19 after depositing a capping dielectric material into the recess resulting from the formation of the recessed non-planar transistor gate, according to an embodiment of the present description.
Figure 21:
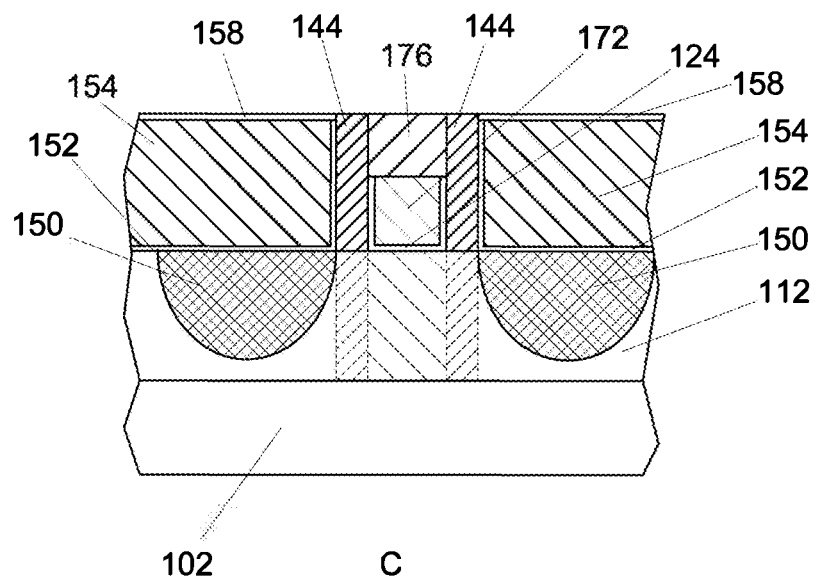
FIG. 21 illustrates a side cross-sectional view of the structure of FIG. 20 after the removal of excess capping dielectric material to form a capping structure on the non-planar transistor gate, according to an embodiment of the present description.

As shown in FIG. 20, a capping dielectric material 174 may be deposited to fill the recess 168 of FIG. 19. The capping dielectric material 174 may be any appropriate material, including but not limited to silicon nitride ($Si_3N_4$) and silicon carbide (SiC), and may be formed by any appropriate deposition technique. The capping dielectric material 174 may be planarized to remove excess capping dielectric material 174 (e.g. capping dielectric material 174 not within the recess of FIG. 19) to form a capping dielectric structure 176 on the recessed non-planar transistor gate 172 and between a gate spacers 144, as shown in FIG. 21. The removal of the excess capping dielectric material 174 may be achieved by any technique known in the art, including but not limited to chemical mechanical polishing (CMP), etching, and the like.

Figure 22:
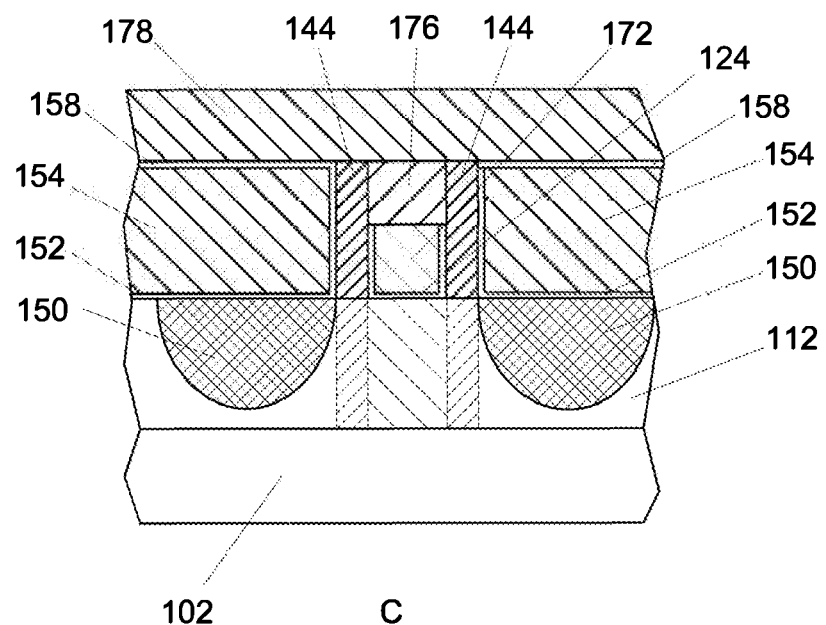
FIG. 22 illustrates a side cross-sectional view of a second interlayer dielectric material layer deposited over the first interlayer dielectric material layer, the gate spacers, and the sacrificial gate top surface of FIG. 21, according to an embodiment of the present description.
Figure 23:
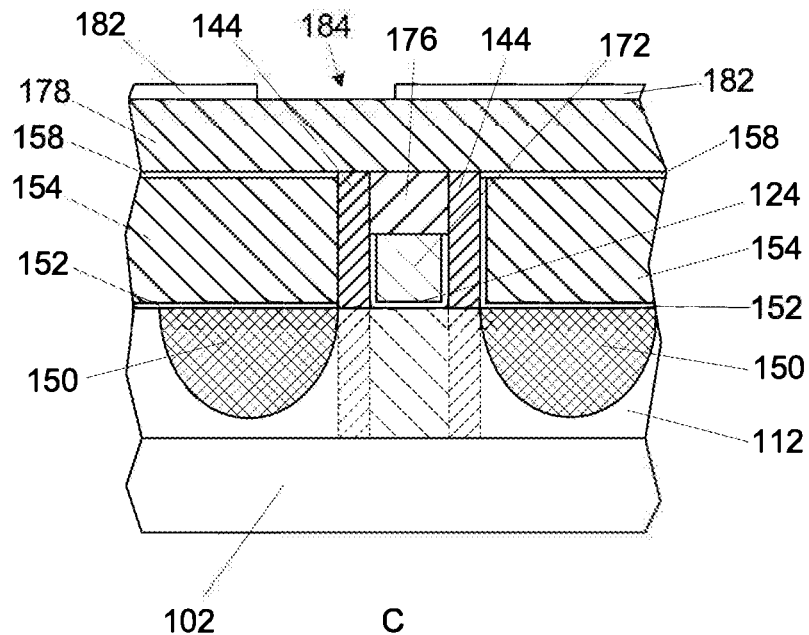
FIG. 23 illustrates a side cross-sectional view of an etch mask patterned on the second dielectric material of FIG. 22, according to an embodiment of the present description.

As shown in FIG. 22, a second interlayer dielectric layer 178 may be deposited over the first dielectric material layer 154, the gate spacers 144, and the capping dielectric structure 176. The second interlayer dielectric layer 178 may be formed from any appropriate dielectric material, including but not limited to silicon dioxide ($SiO_2$), silicon oxynitride ($SiO_xN_y$), and silicon nitride ($Si_3N_4$), by any known deposition technique. As shown in FIG. 23, an etch mask 182 may be patterned with at least one opening 184 on the second interlayer dielectric layer 178, such as by well known lithographic techniques.

Figure 24:
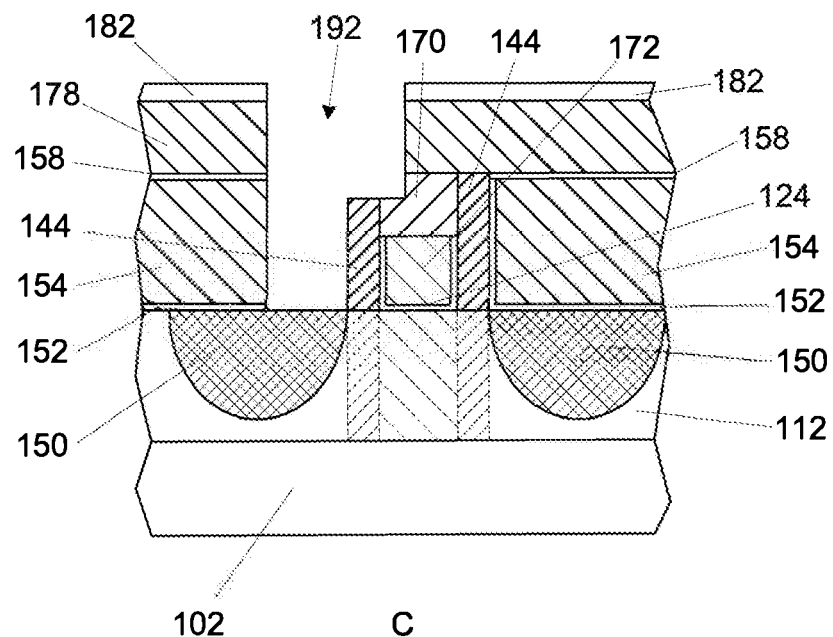
FIG. 24 illustrates a side cross-sectional view of a contact opening formed through the first and second dielectric material layer of FIG. 23, according to an embodiment of the present description.
Figure 25:
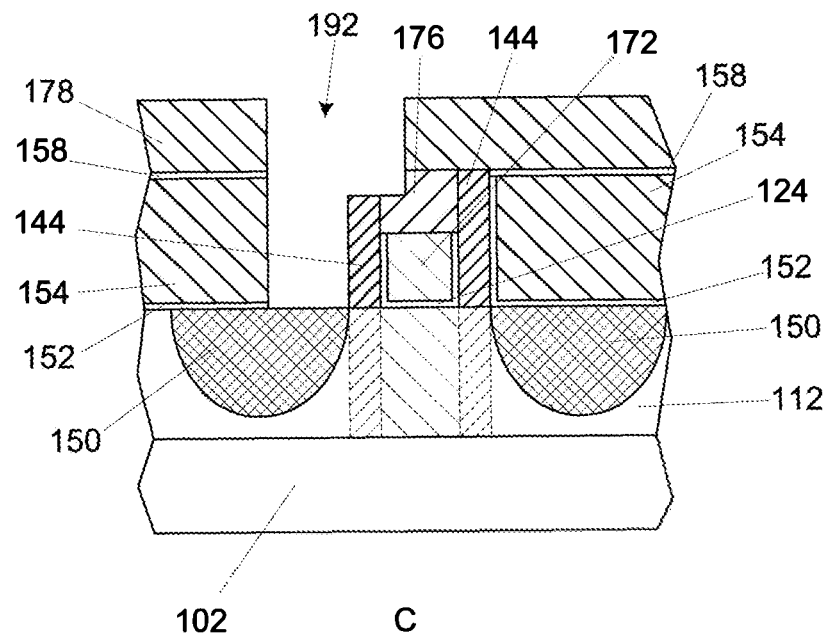
FIG. 25 illustrates a side cross-sectional view of the structure of FIG. 24 after the removal of the etch mask, according to an embodiment of the present description.

As shown in FIG. 24, a contact opening 192 may be formed through the first interlayer dielectric layer 154 and the second interlayer dielectric layer 178 by etching through the etch mask opening 184 of FIG. 23 to expose a portion of the source/drain region 150. The etch mask 182 of FIG. 24 may be removed thereafter, as shown in FIG. 25. In one embodiment, the first interlayer dielectric layer 154 and the second dielectric material layer 178 differs from dielectric material of both the gate spacers 144 and the capping dielectric structure 176, such that the etching of the first interlayer dielectric layer 154 and the second interlayer dielectric layer 178 may be selective to the gate spacers 144 and the capping dielectric structure 176 (i.e. etches faster). This is known in the art as a self-aligning.

Figure 26:
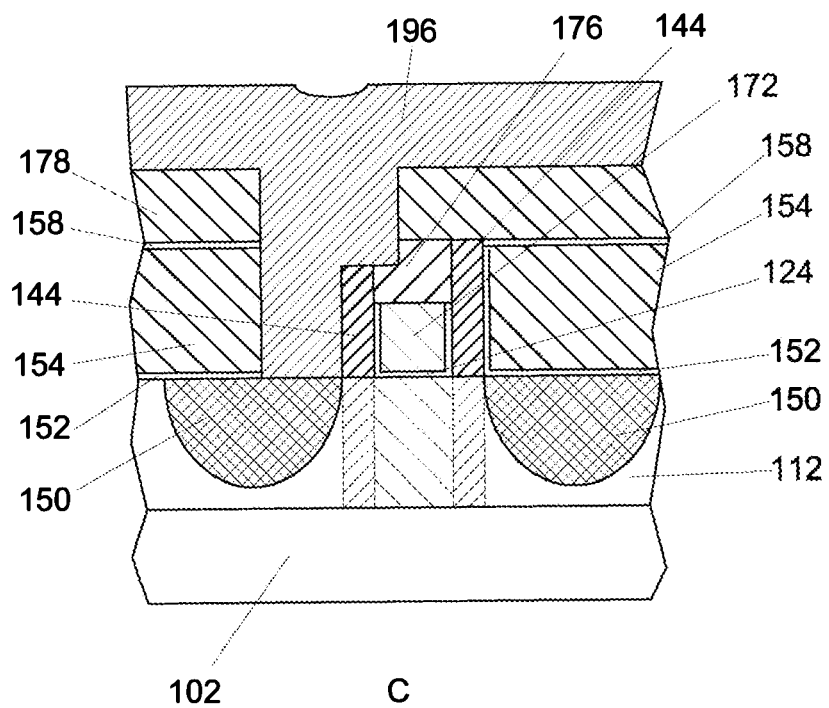
FIG. 26 illustrates a side cross-sectional view of a conductive contact material deposited in the contact opening of FIG. 25, according to an embodiment of the present description.

As shown in FIG. 26, a conductive contact material 196 may be deposited in the contact opening 192 of FIG. 25. The conductive contact material 196 may include, but is not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. It is understood that various adhesion layers, barrier layers, silicide layers, and/or conductive layers may be conformally disposed or formed in the contact opening 192 of FIG. 25 prior to the deposition of the conductive contact material 196.

Figure 27:
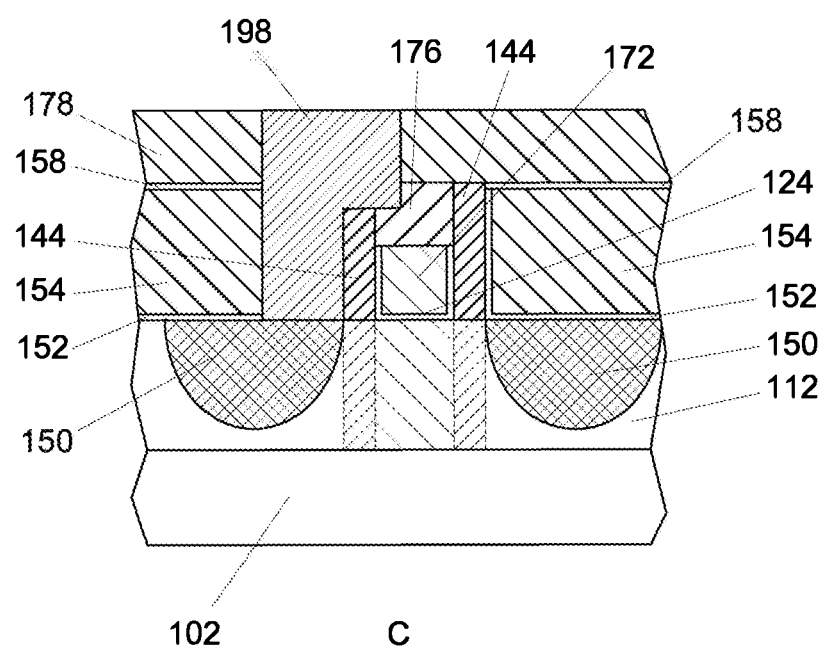
FIG. 27 illustrates a side cross-sectional view of the structure of FIG. 25 after the removal of the excess conductive contact material to form a source/drain contact, according to an embodiment of the present description.

As shown in FIG. 27, excess conductive contact material 196 of FIG. 26 (e.g. conductive contact material 196 not within the contact opening 192 of FIG. 24) may be removed to form a source/drain contact 198. The removal of the excess conductive contact material 196 may be achieved by any technique known in the art, including but not limited to chemical mechanical polishing (CMP), etching, and the like.

As previously discussed, in one embodiment, the first interlayer dielectric layer 154 and the second interlayer dielectric layer 178 differs from dielectric material of both the gate spacers 144 and the capping dielectric structure 176, such that the etching of the first interlayer dielectric layer 154 and the second interlayer dielectric layer 178 may be selective to the gate spacers 144 and the capping dielectric structure 176 (i.e. etches faster). Thus, the recessed non-planar transistor 172 is protected during the formation of the contact opening 192. This allows for the formation of a relatively large sized source/drain contact 198, which may increase the transistor drive current performance, without the risk of shorting between the source/drain contact 198 and the recessed non-planar transistor gate 172.

Figure 28:
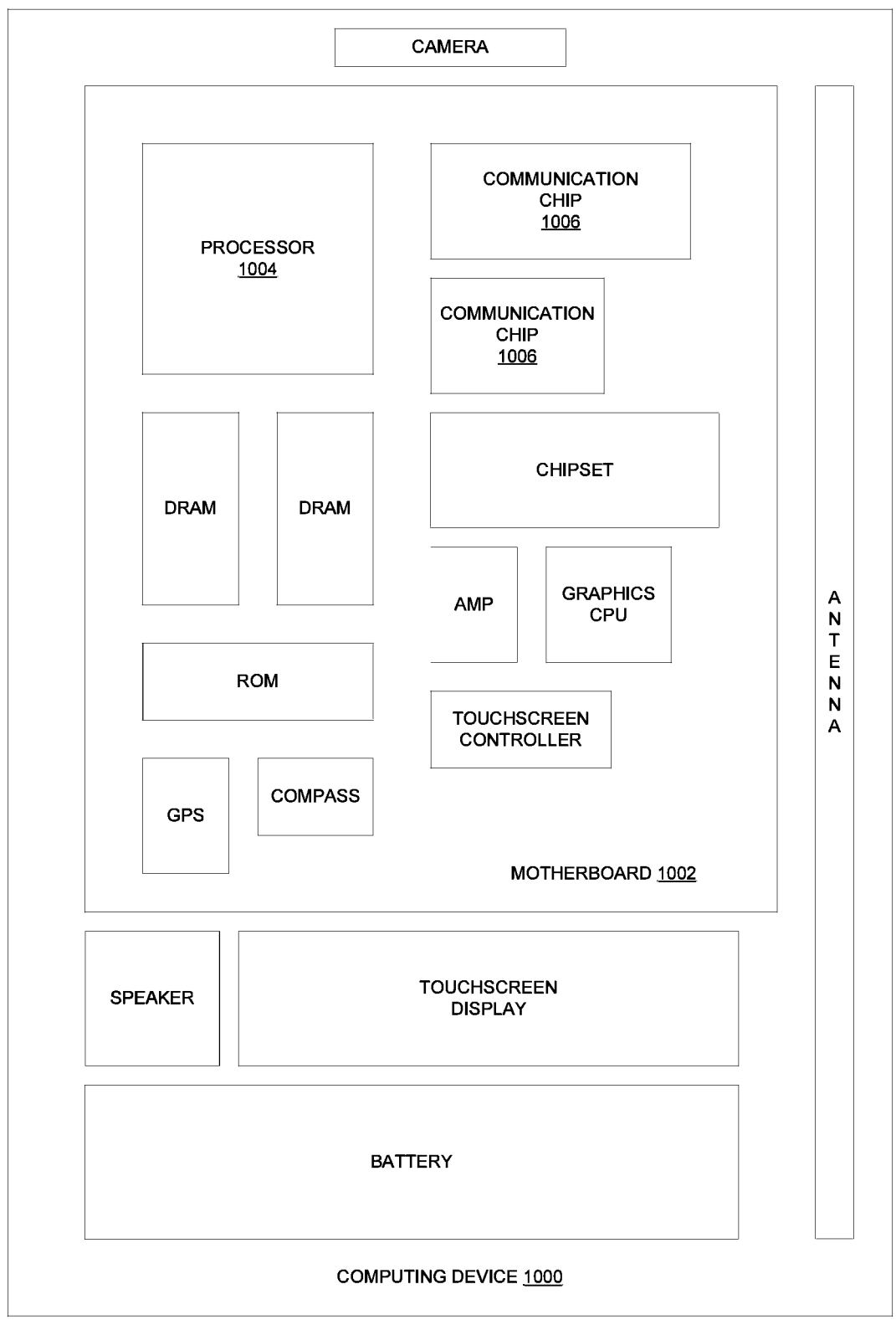
FIG. 28 illustrates a computing device, according to one implementation of the present description.

FIG. 28 illustrates a computing device 1000 in accordance with one implementation of the present description. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the present description, the integrated circuit die of the processor includes one or more devices, such as non-planar transistors that are formed in accordance with implementations of the present description. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the present description, the integrated circuit die of the communication chip includes one or more devices, such as non-planar transistors that are formed in accordance with implementations of the present description.

In further implementations, another component housed within the computing device 1000 may contain an integrated circuit die that includes one or more devices, such as non-planar transistors that are formed in accordance with implementations of the present description.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

It is understood that the subject matter of the present description is not necessarily limited to specific applications illustrated in FIGS. 1-28. The subject matter may be applied to other microelectronic device fabrication applications, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit (IC) structure, comprising:
    a fin having a source and a drain;
    a transistor gate formed on the fin between the source and the drain, wherein the transistor gate comprises a gate electrode, a gate dielectric between the gate electrode and the fin, and a pair of sidewalls formed on opposing sides of the gate electrode;
    spacers on the pair of sidewalls;
    an adhesion liner contacting the spacers, the source, and the drain;
    a dielectric layer contacting the adhesion liner, wherein an upper portion of the dielectric layer has a higher density than a lower portion of the dielectric layer, wherein both the densified portion of the dielectric layer and a non-densified portion of the dielectric layer contact the adhesion liner; and
    at least one contact extending though the dielectric layer contacting at least one of the source and the drain.

2. The integrated circuit (IC) structure of claim 1, wherein the upper portion of the dielectric layer comprises an annealed portion of the dielectric layer.

3. The integrated circuit (IC) structure of claim 1, wherein the upper portion of the dielectric layer comprises an oxidized portion of the dielectric layer.

4. The integrated circuit (IC) structure of claim 1, wherein the upper portion of the dielectric layer comprises an annealed and oxidized portion of the dielectric layer.

5. The integrated circuit (IC) structure of claim 1, wherein the fin comprises silicon.

6. The integrated circuit (IC) structure of claim 1, wherein the dielectric layer comprises silicon and oxygen.

7. The integrated circuit (IC) structure of claim 6, wherein the dielectric layer comprises silicon oxide.

8. The integrated circuit (IC) structure of claim 1, wherein the transistor gate is non-planar.

9. The integrated circuit (IC) structure of claim 1, wherein the source and the drain are non-planar.

10. A method of forming an integrated circuit (IC) structure, comprising:
    forming a fin;
    forming a source and a drain in the fin;
    forming a transistor gate on the fin between the source and the drain, wherein the transistor gate comprises a gate electrode, a gate dielectric between the gate electrode and the fin and a pair of sidewalls formed on opposing sides of the gate electrode;
    forming spacers on the pair of sidewalls;
    forming an adhesion liner contacting the spacers, the source, and the drain;
    forming a dielectric layer contacting the adhesion liner;
    forming a densified portion of the dielectric layer resulting in a densified portion of the dielectric layer and a non-densified portion of the dielectric layer, wherein both the densified portion of the dielectric layer and a non-densified portion of the dielectric layer contact the adhesion liner; and forming at least one contact extending though the dielectric layer contacting at least one of the source and the drain.

11. The method of claim 10, wherein forming the densified portion of the dielectric layer comprises annealing the portion of the dielectric.

12. The method of claim 11, wherein annealing the portion of the dielectric layer comprises annealing the dielectric layer with high density plasma in an inert atmosphere.

13. The method of claim 10, wherein forming the densified portion of the dielectric layer comprises oxidizing the portion of the dielectric layer.

14. The method of claim 13, wherein oxidizing the portion of the dielectric layer comprises heating the dielectric layer in a steam atmosphere.

15. The method of claim 10, wherein forming the densified portion of the dielectric layer comprises oxidizing and annealing the portion of the dielectric layer.

16. The method of claim 10, wherein the fin comprises silicon.

17. The method of claim 10, wherein forming the dielectric layer comprises forming the dielectric layer comprising silicon and oxygen.

18. The method of claim 17, wherein forming the dielectric layer comprises forming a silicon oxide dielectric layer.

19. The method of claim 10, wherein forming the transistor gate comprises forming a non-planar transistor gate.

20. The method of claim 10, wherein forming the source and the drain comprises forming a non-planar source and a non-planar drain.

* * * * *